(12) United States Patent
Jonkers (10) Patent No.: US 6,683,936 B2
(45) Date of Patent: Jan. 27, 2004

(54) EUV-TRANSPARENT INTERFACE STRUCTURE

(75) Inventor: Jeroen Jonkers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/124,035

(22) Filed: Apr. 17, 2002

(65) Prior Publication Data

US 2002/0163793 A1 Nov. 7, 2002

(30) Foreign Application Priority Data

Apr. 17, 2001 (EP) .............................. 01201389

(51) Int. Cl.⁷ ................................................ G21K 5/00
(52) U.S. Cl. ............................................ 378/34; 378/35
(58) Field of Search ............................. 378/34, 35, 30; 355/30, 68

(56) References Cited

U.S. PATENT DOCUMENTS

| | | | |
|---|---|---|---|
| 5,305,364 A | * 4/1994 | Mochiji et al. | 378/34 |
| 5,353,323 A | * 10/1994 | Hirokawa et al. | 378/34 |
| 6,072,852 A | * 6/2000 | Hudyma | 378/34 |
| 6,449,086 B1 | * 9/2002 | Singh | 359/61 |
| 6,459,472 B1 | * 10/2002 | De Jager et al. | 355/68 |

FOREIGN PATENT DOCUMENTS

| | | | |
|---|---|---|---|
| EP | 0532968 A1 | 3/1993 | G03F/7/20 |
| EP | 0957402 A2 | 11/1999 | G03F/7/20 |
| JP | 58-191433 | * 11/1983 | 378/34 |
| WO | 09942904 A | 8/1999 | G03F/7/20 |

OTHER PUBLICATIONS

Glenn D. Kubiak, et. al. High–Power Source and Illumination System For Extreme Ultraviolet Lithography, Proceedings of the SPIE.

Klaus Bergmann, et. al. Highly Repetitive, Extreme–ultraviolet Radiation Source Based on a Gas-discharge Plasma, Proceedings of the SPIE.

* cited by examiner

*Primary Examiner*—Edward J. Glick
*Assistant Examiner*—Irakli Kiknadze
(74) *Attorney, Agent, or Firm*—Aaron Waxler (57) ABSTRACT

An EUV-transparent interface structure for optically linking a first closed chamber (80) and a second closed chamber (70) whilst preventing a contaminating flow of a medium and/or particles from one chamber to the other comprises an EUV-transparent member (60) in the form of a membrane (60) or a channel structure (100). An EUV-transparent (inert) gas (68) is forced to flow at the side of the member facing the source of contamination (LA; W) and towards the source of contamination to keep the contaminating particles away from the member (60; 100). The interface structure may be arranged between an EUV radiation source (LA) and the illuminator optics (IL) and/or between the projection system (PL) and the resist layer (RL) on top of a substrate (W) in a lithographic projection apparatus.

14 Claims, 4 Drawing Sheets

EUV-TRANSPARENT INTERFACE STRUCTURE

FIELD OF THE INVENTION

The invention relates to an EUV-transparent interface structure for optically linking a first closed chamber and a second closed chamber whilst preventing a contaminating flow of a medium and/or particles from one chamber to the other.

The invention also relates to an EUV illuminating device comprising such an interface structure and to an EUV lithographic projection apparatus provided with such an EUV-transparent interface structure and/or illumination device. The invention further relates to a method of manufacturing devices wherein such an apparatus is used.

BACKGROUND AND SUMMARY OF THE INVENTION

A lithographic apparatus is an essential tool in the manufacture of integrated circuits (ICs) by means of masking and implantation techniques. By means of such an apparatus, a number of masks having different mask patterns are successively imaged at the same position on a semiconductor substrate.

A substrate is understood to mean a plate of material, for example silicon, in which a complete multilevel device, such as an IC, is to be formed level by level by means of a number of successive sets of processing steps. Each of these sets comprises as main processing steps: applying a radiation-sensitive (resist) layer on the substrate, aligning the substrate with a mask, imaging the pattern of this mask in the resist layer, developing the resist layer, etching the substrate via the resist layer and further cleaning and other processing steps. The term substrate covers substrates at different stages in the manufacturing process, i.e. both a substrate having no level or only one level of already configured device features and a substrate having all but one level of already configured device features, and all intermediate substrates.

The minimum size of the device structures that can be imaged with the required quality by a lithographic projection apparatus depends on the resolving power, or resolution, of the projection system of this apparatus. This resolution is proportional to $\lambda/NA$, wherein $\lambda$ is the wavelength of the projection beam used in the apparatus and NA is the numerical aperture of the projection system. To produce devices with a higher density, and hence higher operating speeds, smaller device structures have to be imaged so that the resolution should be increased. To this end, the numerical aperture could be increased and/or the wavelength decreased. In practice, an increase of the numerical aperture, which is currently fairly large, is not very well possible because this reduces the depth of focus of the projection system, which is proportional to $\lambda/NA^2$ and, moreover, it becomes too difficult to correct the projection system for the required image field. Therefore, the wavelength is reduced to decrease the minimum device feature that can still be imaged satisfactorily.

Conventional lithographic projection apparatuses employ ultraviolet (UV) radiation, which has a wavelength of 356 nm and is generated by mercury lamps, or deep UV (DUV) radiation, which has a wavelength of 248 nm or 193 nm and is generated by excimer lasers. More recently it has been proposed to use extreme UV (EUV) radiation in the projection apparatus. With such a radiation, also called soft-x ray radiation, which has a considerably smaller wavelength, considerably smaller device features can be imaged. EUV radiation is understood to mean radiation with a wavelength from a few to some tens of nm and preferably of the order of 13 nm.

Possible EUV radiation sources include, for example, laser-produced plasma sources and discharge plasma sources. A laser-produced plasma EUV source is described, for example, in the article: "High-power source and illumination system for extreme ultraviolet lithography" in: Proceedings of the SPIE Conference on EUV, X-Ray and Neutron Optics and Sources, Denver, July 1999, Vol.3767, pages 136–142. A discharge plasma source is described in, for example, the article: "Highly repetitive, extreme-ultraviolet radiation source based on gas-discharge plasma" in Applied Optics, Vol.38, No.25, Sep. 1, 1999, pages 5413–17.

EUV radiation sources, such as the discharge plasma source referred to above, require the use of a rather high partial pressure of a gas or vapor to emit EUV radiation. In a discharge plasma source, a discharge is created in between two electrodes, and ionized plasma generated is subsequently caused to collapse to yield very hot plasma that emits radiation in the EUV range. The very hot plasma is often created in xenon (Xe), since xenon plasma radiates in the EUV range around 13.5 nm. For an efficient EUV production, a typical pressure of 0.1 mbar is required near the electrodes of the radiation source. A drawback of having such a rather high xenon pressure is that xenon gas absorbs EUV radiation. For example, xenon gas with a pressure of 0.1 mbar transmits over 1 m only 0.2% EUV radiation having a wavelength of 13.5 nm. It is therefore required to confine the rather high xenon pressure to a limited region around the source. To this end, the source can be embedded in its own vacuum chamber that is separated by a chamber wall from the next vacuum chamber in which at least a part of the illumination optics, comprising a collector mirror, is arranged. Said chamber wall should have an EUV-radiation transparent opening to pass the EUV radiation from the source to the subsequent chamber, whilst the different vacuum levels in the source chamber and said next chamber should be maintained.

A problem with a discharge plasma source, but also with other plasma sources like a laser-produced plasma source, is the relatively large amount of debris, e.g. contaminating particles, produced by this source. For a discharge plasma source, the debris stems mainly from erosion of the electrodes, by interaction of the plasma with these electrodes, and from erosion of the walls of the source chamber. Such an erosion of the walls, which is due to the high temperature generated in the source chamber, also occurs in a laser-produced plasma source. Moreover, the plasma, like xenon plasma, may emit high-energetic ions. The contaminating particles and ions may escape through the opening in the wall of the source chamber and reach optical components, or reflectors of the illumination system. These components, the first one of which is a collector mirror, for example a grazing-incidence mirror, are composed of a number of thin layers of, for example, silicon and molybdenum. They are very vulnerable and their reflection coefficient is easily decreased to an unacceptable level when they are hurt by such particles. As a consequence, the intensity of the EUV illumination beam would become too small.

Another problem in a lithographic projection apparatus is that debris and byproducts, in general material, may be sputtered loose from the resist layer by the EUV beam. The evacuated intervening space between the substrate and the projection system allows the released material to migrate towards the projection system without undergoing substantial scattering or deflection. In the projection system, the material is deposited on one or more mirrors, thereby forming a spurious coating, which has a roughening effect on the mirror surfaces. As a result of this, the resolution and definition of the images formed by means of the projection rapidly degenerate. Moreover, the reflection coefficient of the mirrors decreases so that less EUV radiation can reach the resist layer.

It is an object of the present invention to provide means for solving the above-mentioned problems and to improve the performance of a lithographic projection apparatus.

According to a first aspect of the invention, it provides an EUV-transparent interface structure as defined in the opening paragraph, which is characterized by an EUV-transparent member and a gas guide for injecting a flow of EUV-transparent gas in the neighborhood of the member surface facing the contaminating flow and for flushing the EUV-transparent gas in a direction opposite to the direction of the contaminating flow.

The member blocks the flow of contaminating particles on their way to the vulnerable components. In order to be sufficiently transparent to the EUV radiation, this member should be relatively thin so that it may be destroyed by the high-energetic contaminating particles. To increase the lifetime of the member, an EUV-transparent gas is injected at the membrane surface that would be hit by the contaminating particles, and this gas flushes opposite to the direction of the contaminating flow so that it substantially keeps the contaminating particles away from the member. The member thus has to block only the very few particles that are not carried away by the flow of EUV-transparent gas. In this way, an effective and long-lasting block for contaminating particles is obtained.

The EUV-transparent interface structure is preferably further characterized in that the EUV-transparent gas is an inert gas.

Such an inert gas, like helium or argon absorbs only little of the EUV radiation. Since only few electrons of the helium gas can be excited by the EUV radiation, this gas is very transparent to EUV radiation. Argon molecules are larger than those of helium gas. This means that argon gas, on the one hand, better captures the contaminating particles and, on the other hand, has a somewhat lower transparency than helium gas.

According to a further preference, the EUV-transparent interface structure is characterized in that the gas guide is constructed to inject the flow of EUV-transparent gas in at least two diametrically opposite directions.

An optimum gas flow along the membrane surface and towards the source of contamination is thereby obtained.

The EUV-transparent structure is preferably further characterized in that it comprises a hollow tube in the form of a cone, the narrowest opening of which faces the contaminating flow.

Such a cone-shaped tube has the minimal volume which is necessary to encapsulate the EUV radiation. This is advantageous, because it minimizes the flow of EUV-transparent gas required for producing an effective flush, leading to gas savings and a lower absorption.

A first embodiment of the EUV-transparent interface structure is characterized in that the member is a membrane.

This embodiment is preferably further characterized in that the membrane is made of silicon.

A thin membrane of silicon shows the required EUV-transparency. The membrane may also be made of zirconium or boron.

A second embodiment of the EUV-transparent interface structure is characterized in that the member is a channel structure comprising adjacent narrow channels separated by walls, which are substantially parallel to a propagation direction of EUV radiation to be transmitted by the channel structure.

This embodiment is especially suitable to maintain different vacuum levels in adjacent vacuum chambers.

The second embodiment is preferably further characterized in that the width of the channels increases or decreases in said propagation direction in accordance with a diverging or converging shape of the beam of EUV radiation.

The channel structure can then transmit a maximum amount of EUV source radiation.

The second embodiment may be further characterized in that the channel structure comprises a honeycomb structure.

The second embodiment is preferably characterized in that a cross-sectional dimension of said channels in a radial direction perpendicular to said propagation direction is larger than a cross-sectional dimension of said channels in a tangential direction around said propagation direction.

The invention also relates to an EUV illumination device, which comprises an EUV radiation source arranged in a first chamber and an optical system for receiving EUV radiation from the first chamber and transforming this radiation into an EUV radiation beam, the optical system being arranged in at least a second chamber. This illumination system is characterized in that an EUV-transparent interface structure as described hereinbefore is arranged between the first and the second chamber and in that the flow of EUV-transparent gas is flushed towards the source.

The components of the optical system, especially a first, collector, mirror are well protected against contaminating particles so that their reflection coefficient remains at an acceptable level during the lifetime of the illumination system.

The invention also relates to an EUV lithographic projection apparatus, which comprises an illumination device supplying an EUV beam for illuminating a mask, a mask holder for holding the mask, a substrate holder for holding a substrate and a projection system arranged between the mask holder and the substrate holder for imaging a mask pattern on the substrate by means of the EUV beam. This apparatus is characterized in that the projection system comprises at least one EUV-transparent interface structure with a membrane as described herein before.

The components of the projection system may be arranged in more than one chamber, while each chamber may be at a different vacuum level. Any one of the chambers may be provided with the EUV-transparent interface structure of the present invention, although the amount of debris in intermediate chamber(s) is considerably smaller than in the last chamber facing the substrate.

An optimum use of the invention is made in an apparatus, wherein the substrate is arranged in a substrate chamber and which is characterized in that an EUV-transparent interface structure is arranged between the last chamber of the projection system and the substrate chamber, and in that the flow of EUV-transparent gas is flushed towards the substrate.

The components of the projection system, especially those arranged in said last chamber, but also those arranged in other chambers are now protected against particles freed from the resist layer by the EUV radiation.

This embodiment is preferably further characterized in that its illumination device is a device as described herein before.

The whole projection apparatus is then well-protected against contaminating particles from both the radiation source and the resist layer on the substrate.

Finally, the invention also relates to a method of manufacturing a device comprising device features in at least one level of a substrate, which method comprises at least one set of the following successive steps:

forming a patterned coating on the substrate, the pattern of which corresponds to the device features in the level to be formed, and removing material from or adding material to areas of said device level being formed, which areas are delineated by the pattern of the patterned coating. This method is characterized in that the patterned coating is made by means of an EUV lithographic projection apparatus as described herein before.

By use of the invention, the lithographic projection process becomes a reliable process and the manufactured devices have a constant, good quality.

These and other aspects of the invention are apparent from and will be elucidated by way of non-limitative example with reference to the embodiments described hereinafter.

DETAILED DESCRIPTION OF THE INVENTION

Figure 1:
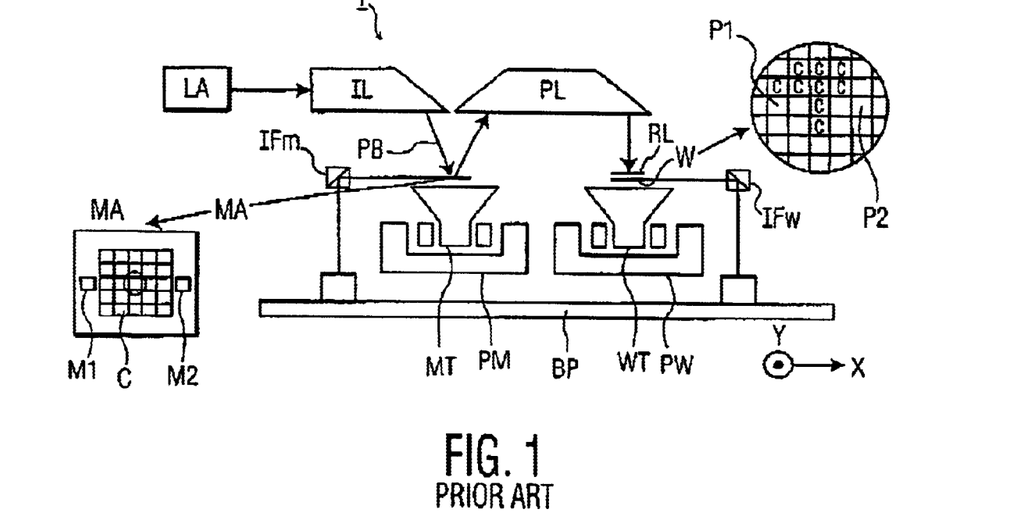
FIG. 1 schematically shows a prior art embodiment of a lithographic projection apparatus for repetitively imaging a mask pattern on a substrate, in which the invention can be used.

The main modules of the lithographic projection apparatus schematically depicted in FIG. 1 are:

an illumination system LA/IL for providing a projection PB of EUV radiation;

a first object table, i.e. the mask table, MT provided with a. first object (mask) holder for holding a mask, or reticle, MA;

a second object table, i.e. the substrate table, WT provided with a second object (substrate) holder for holding a substrate W, e.g. a silicon wafer coated with a resist layer, and a projection system PL for imaging an illuminated portion of the mask MA on a target portion, i.e. an IC area or die, C.

The projection system may be a system of refractive or reflective elements, a catadioptric system or a combination of such systems.

The apparatus is also provided with a number of measuring systems. A first system is an alignment-detection system for measuring the mutual alignment, in an XY plane, of the mask MA and the substrate W. A second measuring system is an interferometer system IF for measuring the X and Y positions and orientation of the substrate holder, and thus of the substrate. A third measuring system is a focus-error detection system for determining a deviation between the focus, or image, plane of the projection system and the surface of the resist layer on the substrate. These measuring systems, which are only partly shown in FIG. 1, form part of servosystems, which comprise electronic signal-processing and control circuits and actuators by means of which the position and orientation of the substrate and the focus can be corrected by means of the signals supplied by the measuring systems. In FIG. 1, PW represents the actuator, or positioning, means for the substrate table WT.

The mask MA in the apparatus shown in FIG. 1 is a reflective mask and this apparatus can be denoted as a reflective apparatus. The apparatus may also be of the transmission type, i.e. an apparatus suitable for projecting a transmission mask pattern on the substrate.

The lithographic apparatus may be a stepping apparatus or a step-and-scanning apparatus. In a stepping apparatus, a full-field illumination is used, i.e. the entire mask pattern C is illuminated in one operation step and imaged as a whole on an IC area of the substrate. After a first IC area has been illuminated, a step is made to a subsequent IC area, i.e. the substrate holder and the mask holder are moved relative to each other so that the subsequent IC area is positioned under the mask pattern. Then the subsequent IC area is illuminated via the mask pattern, and so forth until all IC areas of the substrate have been provided with an image of the mask pattern. In a step-and-scanning apparatus, only a rectangular or circular segment-shaped area of the mask pattern and hence also a correspondingly shaped sub-area of the substrate IC area is each time illuminated. The mask pattern and the substrate are synchronously moved through the projection beam PB, while taking the magnification of the projection beam into account. A subsequent sub-area of the mask pattern is each time imaged on a corresponding sub-area of the relevant IC area of the substrate. After the entire mask pattern has been imaged on a substrate IC area in this way, the substrate holder performs a stepping movement, i.e. the beginning of the next IC area is moved into the projection beam and the mask is set, for example, in its initial position whereafter said next IC area is scan-illuminated via the mask pattern.

In addition to a substrate-positioning means PW and a substrate interferometer system IFw, a step-and-scanning apparatus also comprises also a mask-positioning means PM and a mask interferometer system IFm.

The left section of FIG. 1 shows that the mask MA comprises, for example, two alignment marks M1 and M2 outside the area of the mask pattern. These marks are, for example, diffraction gratings. Alternatively, they may also be constituted by other marks, like squares or strokes, which are optically different from their surroundings. The alignment marks are preferably two-dimensional, i.e. they extend in two mutually perpendicular directions, the X and Y directions in FIG. 1. The substrate W comprises at least two alignment marks, two of which, P1 and P2 are shown in the right section of FIG. 1. The substrate marks P1 and P2 are positioned outside the area of the substrate where the images of the mask pattern have to be formed. The mask and substrate alignment marks are used to detect the degree of alignment of the substrate and the mask during an alignment step, which precedes the step of exposure of the substrate with the mask pattern.

The projection, or exposure, beam PB supplied by the illumination system LA/IL is a beam of EUV radiation, for example, with a wavelength of the order of 13 nm. With such a beam, very small device features, or line-widths, well below 100 nm can be imaged in the resist layer. The illumination system supplying such a beam comprises a plasma source LA, which may be a discharge plasma source or a laser-produced plasma source. In a discharge plasma source, a discharge is created in a medium between two electrodes and ionized plasma, resulting from the discharge, is subsequently caused to collapse so that a very hot plasma is obtained that emits the required EUV radiation. A suitable medium is xenon, because xenon plasma radiates in the required EUV range. A discharge plasma EUV source is described, for example in the article: "Highly repetitive extreme-ultraviolet radiation source based on gas-discharge plasma" in: Applied Optics, Vol. 38, No.25, Sep. 1, 1999, pages 5413–5417. In a laser-produced-plasma source, a gaseous, liquid or solid medium, the target medium, is converted to plasma by an intense laser beam focused on the medium. A laser-produced plasma source is disclosed, for example, in the article: "High-power source and illumination system for extreme ultraviolet lithography" in: "Proceedings of the SPIE Conference on EUV, X-Ray and Neutron Optics and Sources, Denver, July 1999, Vol. 3767, pages 136–142.

The illumination system comprises various optical components, e.g. mirrors to capture and guide source radiation and shape this radiation to a suitable projection beam PB, which illuminates the mask MA. The beam reflected by the mask passes through the projection system PL, which focuses this beam in the resist layer on top of the substrate, to form an image of the mask pattern at the position of a selected substrate area.

Figure 2:
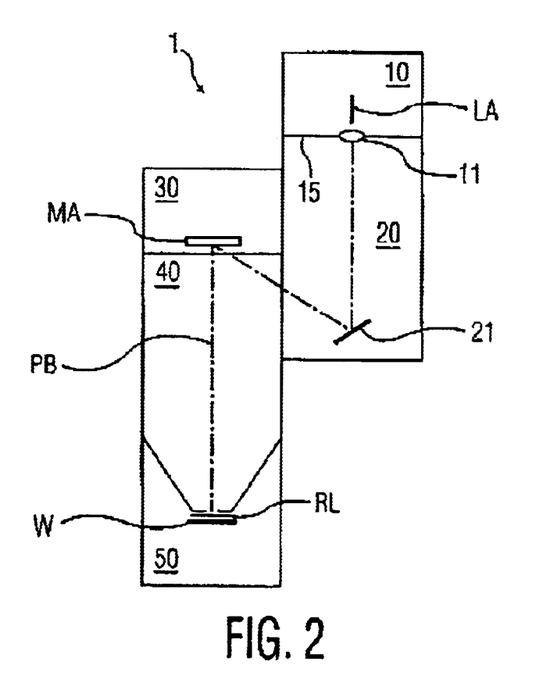
FIG. 2 schematically shows the various vacuum chambers of a lithographic projection apparatus.

As is shown very schematically in FIG. 2, the various components of an EUV lithographic projection apparatus are distributed over a number of vacuum chambers. These chambers are separated by walls, in which windows are present for passing the projection beam from one vacuum chamber to the next. FIG. 2 shows a source chamber 10 containing the source LA, an illumination optics chamber 20 containing a collecting mirror and possibly further mirrors which determine the shape and vergence of the projection beam, a chamber 30 containing the mask MA, a projection optics chamber 40 containing the components of the projection system PL and a chamber 50 containing the substrate W. In the various chambers, different vacuum levels may be maintained. The illumination and projection optics chambers require a high vacuum level to keep the optical path of the projection beam through these chambers transparent to this EUV beam. Moreover, it should be prevented that contaminating particles enter these chambers and reach the optical components. Such particles would considerably reduce the reflectivity and quality of the mirrors and would thus be detrimental for the performance of the projection apparatus. One kind of contamination stems from the EUV radiation source, which produces debris either by erosion of the electrodes and the chamber walls in the case of a discharge plasma source or by ion or particles escaping from the plasma and wall erosion in the case of a laser-produced plasma source. Another kind of contamination stems from the resist layer on the substrate, which layer produces organic vapors and other debris upon irradiation with the EUV projection beam.

Figure 3:
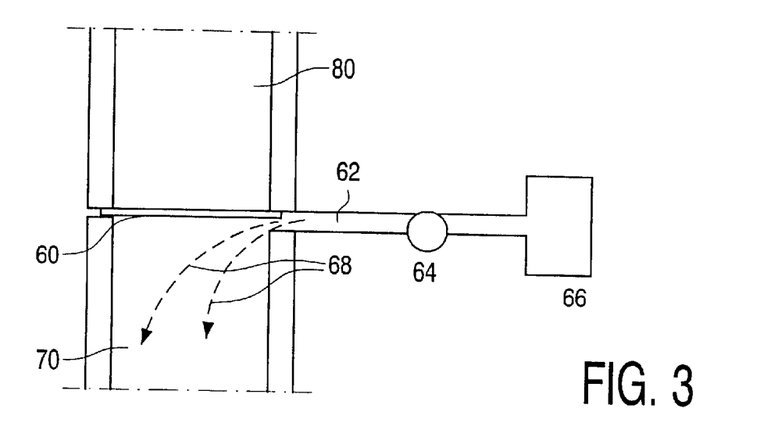
FIG. 3 schematically shows an embodiment of an EUV-transparent interface structure used in this apparatus.

According to the invention, the components which are exposed to a flow of contaminating particles are protected by providing a specific EUV-transparent structure as an interface between the chamber wherein said components are accommodated and the source of contamination. An embodiment of such a structure is schematically shown in FIG. 3. The structure comprises a thin membrane 60 made of, for example, silicon, which shows sufficient transparency to EUV radiation and blocks a flow of contaminating particles. This membrane separates a first chamber 70 from a second chamber 80. Chamber 70 is the chamber wherein contaminating particles are generated or through which such particles coming from another chamber flow. Chamber 80 accommodates optical components, not shown, which should be protected. In order to prevent the membrane from being damaged by a heavy flow of contaminating particles and/or to prevent the transmission of this membrane from being considerably reduced by deposition of contaminating particles, a flow of gas is flushed towards the source of contamination. The broken and bent arrows 68 in FIG. 3 indicate this flow of gas. The gas flows in a direction opposite to the direction of the flow of contaminating particles, and carries these particles away from the membrane and from the chamber 80. The gas, which should be transparent to EUV radiation, is preferably an inert gas, like helium or argon, or xenon. Via a guide 62 and through an opening in the wall of the chamber 70, the gas flows into this chamber. The gas is supplied from a gas container 66. In the gas guide 62, a gas flow controller 4 may be arranged for better control of the gas flow into the chamber 70.

Figure 4:
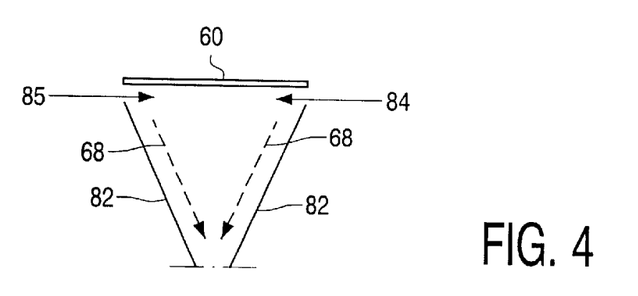
FIG. 4 shows a preferred embodiment of this interface structure.

FIG. 4 shows a second and preferred embodiment of the EUV-transparent interface structure. In this embodiment, the EUV-transparent gas is injected into the chamber via at least two, and preferably more, opposite openings in the wall, which openings are arranged on a circle at the lower side of the membrane as indicated by the arrows 84 and 85. The larger the number of openings, the better the spread of the gas flow and the better the removal of contaminating particles is guaranteed.

As is also illustrated in FIG. 4, the shape of the gas flow is preferably adapted to the local shape of the EUV beam. To this end, the gas flow is embanked by a hollow cone 82, which has such dimensions and shape that the EUV beam can just pass through it. This beam may be a convergent beam, which propagates in the downward direction, or a divergent beam, which propagates in the upward direction. The advantage of using the conical member is that the space between the membrane and the source of contamination can be washed effectively with a relatively small amount of inert gas. Then not only gas can be saved, but it becomes also easier to remove the gas from the apparatus.

Figure 5:
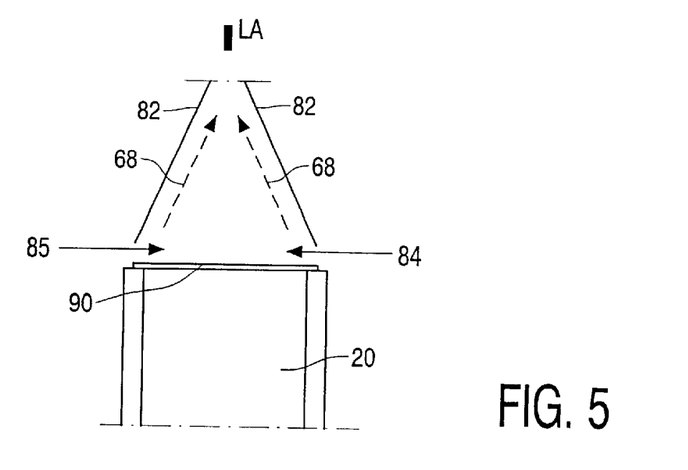
FIG. 5 shows the application of the interface structure in an illumination device.

FIG. 5 illustrates the application of the EUV-transparent interface structure in an illumination system. LA is an EUV laser-plasma, or a discharge-plasma, source, the downward directed radiation of which is used for forming an EUV illumination beam. The conical shaped member 82 has such a shape and dimensions that it captures sufficient EUV radiation, which passes through the membrane 90 to enter a chamber 20 wherein at least a first collector mirror (not shown) is arranged. At the upper side of the membrane, EUV-transparent gas is injected along a number of diametrically opposite directions, indicated by the arrows 84 and 85, such that the gas flows through the member 82 to the source LA. The gas flow substantially prevents contaminating particles from the source from reaching the membrane and thus the chamber with illuminator optics.

Figure 6:
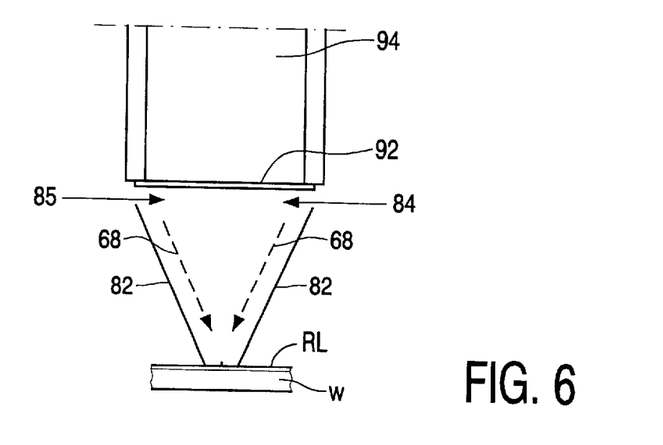
FIG. 6 shows the application of the interface structure between the projection system and the substrate.

FIG. 6 shows the application of the interface structure between the image-side end of the objective system and the substrate. In this Figure, the chamber, or the last of the multiple chambers, wherein the components (mirrors) of the projection system are arranged, is denoted by reference numeral 94. At the lower side of the chamber 94, an EUV-transparent substrate 92 is arranged. As indicated by the arrows 84 and 85, an EUV-transparent gas is injected at the lower side of the membrane along a number of diametrically opposite directions. This gas flushes the space between the membrane and the resist layer RL on top of the substrate W and substantially prevents that contaminating particles, like hydrocarbons and radicals, which may be emitted by the resist upon illumination with EUV radiation, reach the membrane. A conical member 82, which just passes the EUV convergent projection beam to the resist layer, is arranged between the membrane and the resist layer.

The EUV-transparent interface structure may not only be used to mechanically isolate the radiation source or the substrate with the resist layer from neighboring chambers provided with optical components, but also for such isolation of other chambers in the illumination system or the projection system having different vacuum levels.

Instead of a membrane, the EUV-transparent member of the interface structure may also be a channel structure composed of adjacent narrow channels separated by walls. Such a channel structure may be used as a gas barrier between the radiation source chamber and the next chamber, which contains the collector mirror and illumination optics. As already mentioned, the target medium in the radiation source member should have a rather high pressure whilst the next chamber should have a high vacuum level. The different vacuum levels in the radiation source chamber and the illuminator channel can be maintained by means of the channel structure. The channel structure divides an opening in a vacuum chamber wall into a number of narrow adjacent channels. The flow conductance of the opening is thereby considerably decreased, or its resistance to the gas flow is considerably increased.

Figure 7:
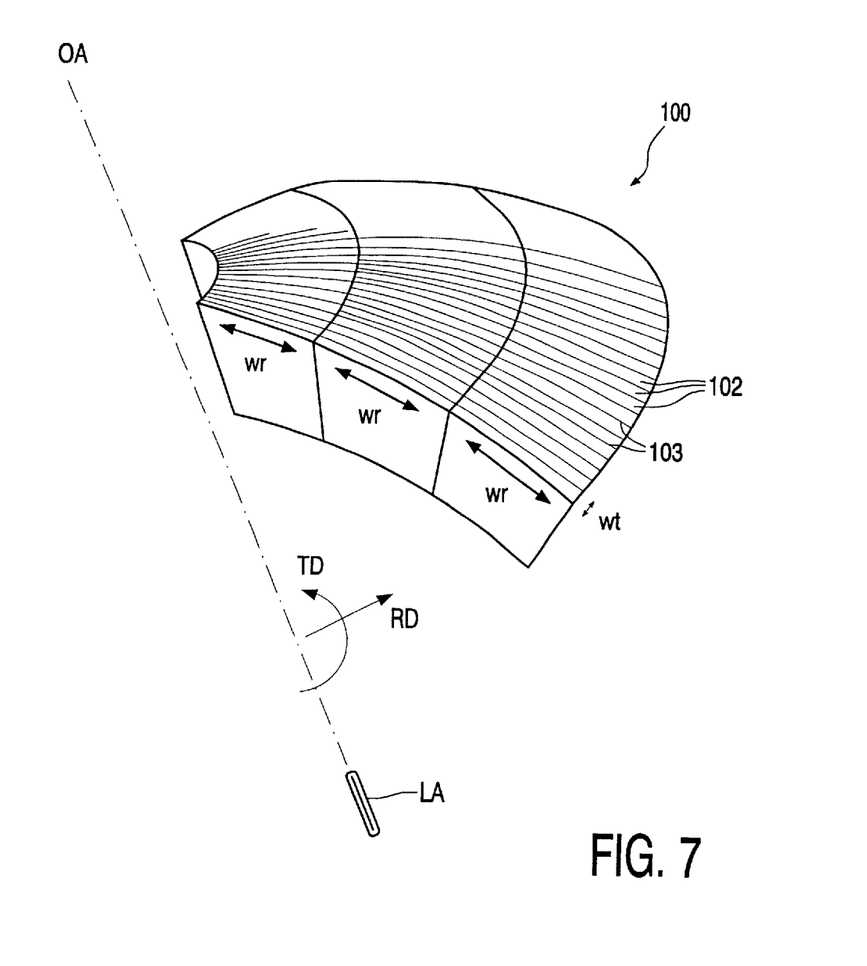
FIG. 7 shows a channel structure for use in the EUV-transparent interface structure.

FIG. 7 shows an embodiment of the channel structure, also called foil-trap, 100. It is composed of a number of adjacent narrow channels 102 separated by walls 103, which are substantially parallel to the propagation direction of radiation emitted by the radiation source LA. This propagation direction is substantially parallel to the optical axis of the system of radiation source and illumination device, which axis is denoted by OA in FIG. 7. The channel structure passes the EUV radiation emitted by the source and at the same time functions as a flow resistance, or barrier, between the source chamber and the next chamber. The structure allows maintaining the next chamber at a much higher vacuum level, or lower pressure level than the source chamber. The form and length of the channels of the channel structure should be chosen so as to provide a high EUV transparency and a sufficiently large flow resistance.

Figure 8:
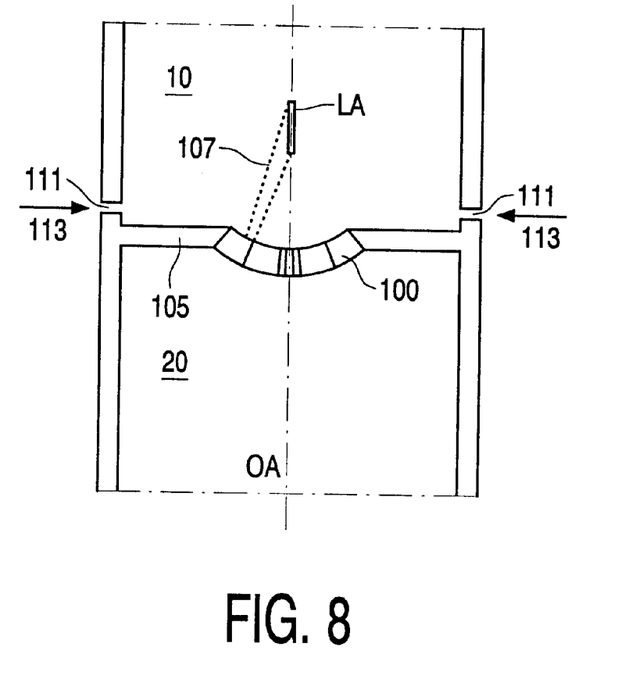
FIG. 8 shows a part of a radiation source/illumination unit provided with this interface structure.

The cross-section in FIG. 8 shows how the channel structure is arranged in the wall 105 between the source chamber 10 and the chamber 20 containing the collector mirror.

FIGS. 7 and 8 show that the region LA, from which EUV radiation is emitted, is elongated along the optical axis, i.e. it has a finite length along the optical axis. To further increase the transmission of EUV radiation through the channel structure for the whole elongated region that emits radiation, the width wr of the channels in a direction perpendicular to the optical axis, i.e. the radial direction, RD in FIG. 7, is chosen to be considerably larger than the channel width wt in the tangential direction, TD in FIG. 7, around the optical axis. If the channels have a small width in the radial direction RD, only radiation from a small part of the elongated region will be transmitted through the channels, while radiation from the remaining part of the region will be incident on the channel walls. Only a small fraction of the radiation energy from the EUV source will then pass through the channel structure 100. FIG. 8 shows two rays 107 in dotted lines, which are emitted from opposite ends of the elongated region LA and are not parallel, which rays enter one channel. If the width of this channel is too small in the radial direction RD, the two rays will not pass through the channel simultaneously.

Figure 9:
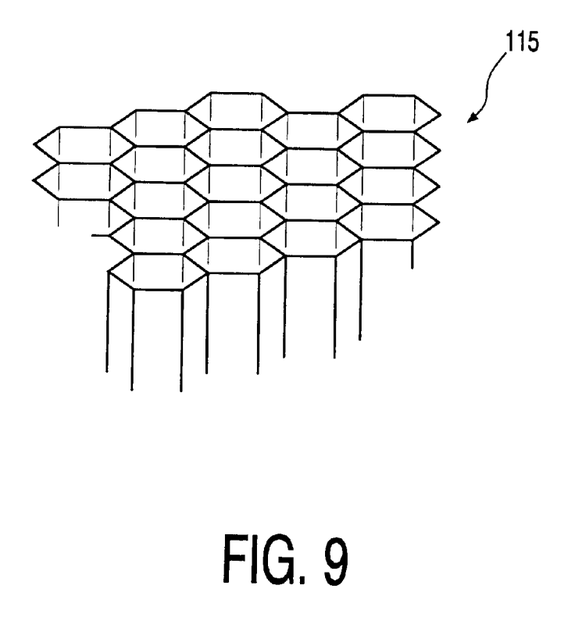
FIG. 9 shows a part of the channel structure having a honeycomb shape.

Channels in the center of the channel structure 100 around the optical axis OA will more or less "see" a point source and therefore these channels need not have a large width in the radial direction RD. As is shown in FIG. 9, these channels may have a honeycomb structure 115. For certain source configurations, the honeycomb structure may be employed for the whole channel structure.

According to the present invention, the wall 109 of the source chamber 10 is provided with a number of diametrical openings 111, through which an EUV-transparent gas, e.g. an inert gas is injected, as is indicated by the arrows 113. This gas flows in a direction opposite to the direction of the contaminating particles and keeps these particles away from the channel structure 100. These particles thus cannot damage or decrease the EUV transparency of this structure.

The invention has an effect on the method of manufacturing devices, for example integrated circuits, in that it guarantees that the devices manufactured by means of the method, which uses a lithographic projection apparatus wherein the invention is implemented, have a constant quality over a long period of time. Imaging a mask pattern in a resist layer, i.e. making a patterned coating on the substrate is one step of the method of manufacturing devices. Prior to imaging the mask pattern in the resist layer, the substrate may undergo various process steps, such as priming, resist coating and a soft bake. After exposure, the substrate may be subjected to other process steps such as development of the resist layer and measurement/inspection of the imaged features. This set of process steps is used as a basis for patterning an individual layer, or level, of the device. Such a patterned layer may undergo various process steps, such as etching, ion implantation (doping) metallization, oxidation, chemo-mechanical polishing, etc., all intended to finish a layer, or level. If several device levels are required, the whole procedure, or a variant thereof, will have to be repeated for each device level. Eventually, an array of devices will be present on the substrate. These devices are then separated from each other by a technique such as dicing or sawing, and the individual devices can be mounted on a carrier, connected to pins, etc. Further information regarding the manufacture of ICs and the various process steps can be obtained, for example, from the book: "Microchip Fabrication: A Practical Guide to Semiconductor Processing", Third Edition, by Peter van Zant, McGraw Hill Publishing Co., 1997, ISBN 0-07-067250-4.

By using the invention, it is ensured that the imaging step, being one of the first steps of the method, produces accurate and reliable images having a quality which remains constant over a long period of time, so that the devices, which finally result from these images, also have a good and constant quality.

Although the invention has been described by specific referencing to the manufacture of ICs, it should be explicitly understood that it has many other applications. For example, it may be employed in the manufacture of integrated and planar optical systems, liquid crystal display panels, thin-film magnetic heads, etc. this has already been expressed by the use of the more general terms: "mask", "substrate" and "target area" instead of the terms: "reticle", "wafer" and "die", respectively, which are more commonly used in the specific IC manufacturing technology.

What is claimed is:

1. An EUV-transparent interface structure for optically linking a first closed chamber and a second closed chamber whilst preventing a contaminating flow of a medium and/or particles from one chamber to the other, characterized by an EUV-transparent member and a gas guide for injecting a flow of EUV-transparent gas in the neighborhood of the member surface facing the contaminating flow and for flushing the EUV-transparent gas in a direction opposite to the direction of the contaminating flow.

2. An EUV-transparent interface as claimed in claim 1, characterized in that the EUV-transparent gas is an inert gas.

3. An EUV-transparent interface structure as claimed in claim 1, characterized in that the gas guide is constructed to inject the flow of EUV-transparent gas in at least two diametrically opposite directions.

4. An EUV-transparent interface structure as claimed in claim 3, characterized in that it comprises a hollow tube in the form of a cone, the narrowest opening of which faces the contaminating flow.

5. An EUV-transparent interface structure as claimed in claim 1, characterized in that the member is a membrane.

6. An EUV-transparent interface structure as claimed in claim 5, characterized in that the membrane is made of silicon.

7. An EUV-transparent interface structure as claimed in claim 1, characterized in that the member is a channel structure comprising adjacent narrow channels separated by walls, which are substantially parallel to a propagation direction of EUV radiation to be transmitted by the channel structure.

8. An EUV-transparent interface structure as claimed in claim 7, characterized in that the width of the channels increases or decreases in said propagation direction in accordance with a diverging or converging shape of the beam of EUV radiation.

9. An EUV-transparent interface structure as claimed in claim 7, characterized in that the channel structure comprises a honeycomb structure.

10. An EUV-transparent interface structure as claimed in claim 7, characterized in that a cross-sectional dimension of said channels in a radial direction perpendicular to said propagation direction is larger than a cross-sectional dimension of said channels in a tangential direction around said propagation direction.

11. An EUV illumination device comprising an EUV radiation source arranged in a first chamber and an optical system for receiving EUV radiation from the first chamber and transforming this radiation into an EUV radiation beam, the optical system being arranged in at least a second chamber, characterized in that an EUV-transparent structure as claimed in claim 1 is arranged between the first and the second chamber, and in that the flow of EUV-transparent gas is flushed towards the radiation source.

12. An EUV lithographic projection apparatus comprising an illumination device supplying an EUV beam for illuminating a mask, a mask holder for holding the mask, a substrate holder for holding a substrate and a projection system arranged between the mask holder and the substrate holder for imaging a mask pattern on the substrate by means of the EUV beam, characterized in that the projection system comprises at least one EUV-transparent interface structure as claimed in claim 1.

13. An EUV lithographic projection apparatus as claimed in claim 12, wherein the substrate is arranged in a substrate chamber, characterized in that an EUV-transparent interface structure is arranged between the last chamber of the projection system and the substrate chamber, and in that the flow of EUV-transparent gas is flushed towards the substrate.

14. An EUV lithographic projection apparatus, characterized in that the illumination device is a device as claimed in claim 12.

* * * * *